(12) United States Patent
Ohira et al.

(10) Patent No.: US 6,259,255 B1
(45) Date of Patent: Jul. 10, 2001

(54) SURGE LOCATING SYSTEM OF POWER TRANSMISSION LINE AND METHOD THEREOF

(75) Inventors: Sakari Ohira, Sendai; Masaaki Ozawa, Hoya; Toshiaki Kojima, Omiya, all of (JP)

(73) Assignees: Tohoku Electric Power Co., Inc., Sendai; Kyokuto Boeki Kaisha, Ltd., Tokyo, both of (JP)

( * ) Notice: Subject to any disclaimer, the term of this patent is extended or adjusted under 35 U.S.C. 154(b) by 0 days.

(21) Appl. No.: 09/207,722

(22) Filed: Dec. 8, 1998

(30) Foreign Application Priority Data

Dec. 18, 1997 (JP) .................................... 9-349101

(51) Int. Cl.[7] .................................................. G01R 31/08
(52) U.S. Cl. .......................................... 324/535; 324/532
(58) Field of Search .................. 324/512, 522, 324/535, 617, 618, 520; 361/64, 118, 115, 113

(56) References Cited

U.S. PATENT DOCUMENTS

| | | | |
|---|---|---|---|
| 3,609,533 | * 9/1971 | Pardis | 324/535 |
| 3,707,673 | * 12/1972 | Carter | 324/535 |
| 3,710,239 | * 1/1973 | Nakamura | 324/535 |
| 3,781,665 | * 12/1973 | Gale | 324/535 |
| 4,499,417 | * 2/1985 | Wright et al. | 324/535 |
| 4,857,854 | * 8/1989 | Matsushima | 324/512 |
| 5,070,537 | * 12/1991 | Ohira et al. | 455/67 |
| 5,508,619 | * 4/1996 | Ozawa et al. | 324/535 |
| 5,729,144 | * 3/1998 | Cummins | 324/535 |

FOREIGN PATENT DOCUMENTS

| | | |
|---|---|---|
| 0 649 029 | 4/1995 | (EP) . |
| 58-28219 | 6/1983 | (JP) . |

OTHER PUBLICATIONS

Patent Abstracts of Japan, vol. 1995, No. 09, Oct. 31, 1995 and JP 07–143666 A, Jun. 2, 1995—Abstract only.
Patent Abstracts of Japan, vol. 1996, No. 07, Jul. 31, 1996 and JP 08–065–885, Mar. 8, 1996—Abstract only.

* cited by examiner

*Primary Examiner*—Safet Metjahic
*Assistant Examiner*—Vincent Q. Nguyen
(74) *Attorney, Agent, or Firm*—Frishauf, Holtz, Goodman, Langer & Chick, P.C.

(57) ABSTRACT

A surge locating system and a method thereof which can accomplish the surge locating with high accuracy and with relatively simple structure. When the surge occurs, the voltage is generated on the neutral point of Y-connected three-phase alternating current transmission line because of losing a voltage balance on the three-phase alternating current transmission line. The surge locating can be accomplished by detecting the voltage generated in the neutral point. The neutral point is grounded, and the surge locating system according to the present invention is installed between the neutral point and the grounding point. The voltage generated in the neutral point is introduced into the surge locating system and the detecting time thereof is stored. This detecting time is stored in the respective stations, and the surge point can be located based on the detecting time difference between the stations.

9 Claims, 8 Drawing Sheets

SURGE LOCATING SYSTEM OF POWER TRANSMISSION LINE AND METHOD THEREOF

FIELD OF THE INVENTION

The present invention relates to a surge locating system for locating a point where a surge occurs on a power transmission line, in particular, to a surge locating system which operates in combination with a wire wound grounding potential transformer (GPT).

A surge occurs on a power transmission line due to grounding, short circuit, back flashover, direct strike of lightning and the like. There has been known a surge locating system of power transmission line which locates a point where a surge occurs by receiving surges in adjacent master station and slave station and by evaluating levels of the surges received in respective stations.

In this type of surge locating system of power transmission line, a time difference between the times when a surge rising up to a certain level is received by adjacent master station and slave station respectively is measured, and then a distance L1 from the master station to the point where the surge occurs is calculated based on the equation (1) as follows:

$$L1 = (L - c \cdot \Delta t)/2 \qquad (1)$$

where,

L: distance between a master station and a slave station placed each end respectively, $\Delta t$: time difference between the times when the surge is received in two stations respectively, c: surge propagation velocity.

Most of the surge locating systems of power transmission line used now widely are so-called B-type or micro B-type, in which the surge rising up to a certain level is received by a surge receiving station called master station and another station called slave station respectively, and the slave station transmits the event that the surge is received to the master station via a telecommunication network line of a ground system or a microwave telecommunication system, and the master station then calculates a time difference between own receiving time and a slave station's receiving time to locate the point where the surge occurs by applying it to the equation (1).

In the surge locating systems of power transmission line mentioned above, it is preferable that the same shape of waveform would be received at the master station and at the slave station. However, a waveform, a duration of wave front length, and a peak value are fluctuated or damped depending on a characteristics of instruments for receiving a surge from a power transmission line or a common bus in such electric facility as transforming station, loading conditions of the instruments, or an influence of other power transmission lines. Therefore, in this conventional surge locating system, the time difference between the surges received at a master station and a slave station must be compensated as if approximately same waveform are received at the master station and the slave station respectively. As for the surge compensating method, there has been known a two-potential method. In the two-potential method, based on the experimental principle that the leading edge of surge may be approximated to a straight line, an intersection point of a line which passes two points each corresponding to detection time of two different specific levels of surge and a line of zero surge level is assumed to be an initial arrival time of surge.

Japanese Utility Model Publication No. 28219 issued in 1983 discloses a surge locating system of power transmission line which uses this type of two-potential method. This surge locating system of power transmission line comprises plural surge detectors, which calculates the surge arrival time based on the intersection point of a line which passes two points each being detected by a surge detector of the highest detected level of surge and by another surge detector of the second highest detected level of surge respectively and a line of zero surge level.

This conventional surge locating device is configured based on the assumption that the surge is introduced through a capacitance potential device (PD).

In the capacitance potential device (PD), though a primary side voltage and a secondary side voltage are damped under predetermined ratios, a waveform introduced into the primary side is, basically without any modification, output to the secondary side. Then, the surge locating is implemented based on the damped surge waveform. The inventors of the present invention previously proposed a surge locating device which provides improved accuracy of surge locating by compensating the surge arrival time in respective electric facilities based on a gradient of received surge wave when the surge locating is implemented based on the surge wave detected through the capacitance potential device (PD).

In such conventional method as of disclosed in the above Japanese Utility Model Publication No. 28219 which determines the surge arrival time at respective stations based on the surge voltage waveform, the arrival time varies depending on the method for compensating or evaluating the surge waveform, so that the compensation or the evaluation directly gives an influence on the exactness of surge locating.

Namely, in the conventional method, the evaluation of the arrival waveforms at respective stations inevitably causes a factor of errors. As a result, it is difficult to accomplish an accurate surge locating.

In view of the above mentioned disadvantage of the conventional surge locating system which uses the conventional capacitance potential device (PD) and is associated with the compensation or the evaluation of the surge voltage waveform, the object of the present invention is to provide a surge locating system and a method thereof which will not necessitate an evaluation analysis of surge voltage waveform and is capable of surge locating with high accuracy by a simple configuration.

SUMMARY OF THE INVENTION

The above mentioned object of the present invention is accomplished by providing a surge locating system of a power transmission line for locating a point where a surge occurs by receiving in at least two stations independently said surge which occurs on the power transmission line, said surge locating system of a power transmission line comprising a surge detecting means for detecting a surge which occurs on the power transmission line, which is connected to a neutral point of a secondary side of a wire wound grounding potential transformer (GPT) connected to said power transmission line, the surge detecting means comprising a surge judging means which judges that a surge is detected when a voltage higher than predetermined level is detected, a time difference calculating means for calculating a time difference between surge detected times detected by the surge judging means in respective stations, and a locating means for locating a point where the surge occurs based on the time difference.

Preferably, the neutral point is a neutral point of a Y-connection three phase alternative current wiring.

In this case, it is also preferable that GPT is connected to the power transmission line via the capacitance potential device (PD).

It is also preferable that the surge detecting means is provided with a voltage limitation means for preventing a voltage higher than the predetermined level from being introduced.

On top of that, the surge detecting means is preferably provided with a high-pass filter which passes a voltage waveform having a frequency higher than a predetermined value.

A preferred embodiment of the invention is characterized in that the surge detecting means is connected to the high-pass filter and is equipped with a low-pass filter which only passes a voltage waveform having a frequency lower than a predetermined value.

In another preferred embodiment of the invention, the surge detecting means is equipped with a transforming means for transforming a surge voltage into other kind of physical quantity. In this case, the transforming means is a photo coupler.

According to another feature of the present invention is provided a surge locating method of a power transmission line for locating a point where a surge occurs by receiving in at least two stations independently the surge which occurs on a power transmission line, the surge locating method of a power transmission line comprising the steps of judging that the surge is detected when a voltage higher than a predetermined level is detected in a neutral point of a secondary side wiring of a wire wound grounding potential transformer (GPT) connected to the power transmission line, calculating a time difference of the surge detected times between at least the two stations, and locating a point where the surge occurs based on the time difference.

The present invention detects a surge on any power transmission line. In particular, the present invention provides a system for locating a surge on a power transmission line based on a signal received through a wire wound grounding potential transformer (GPT).

The present invention is provided due to the fact that, when a surge is detected on the power transmission line through a wire wound grounding potential transformer (GPT), the substantially same output wave is generated in the secondary side of GPT regardless of a frequency of surging input wave. The inventors of the present invention found out that the surge locating can be accurately accomplished without any deterioration on other instruments if the surge signal is tapped from the secondary side at the neutral point. A line from the neutral point is extended along with other secondary power transmission lines and is grounded via a capacitor as connected to a fault detecting wiring.

In a preferred embodiment of the invention, but not restricted thereto, an accurate surge locating can be accomplished by detecting a voltage wave generated on a neutral point of Y-connected three-phase alternating current transmission line.

In detail, under the normal power transmitting condition, an alternating current flows steadily on the three-phase alternating current transmission line without generating any voltage on the neutral point.

When the surge occurs, a voltage due to the surge is generated on the neutral point.

Usually, a neutral point of a secondary side of a transformer is grounded without being connected to any other instruments or devices. Thus, there is no fear of a bad influence on other instruments or devices even though a surge or fault locator is connected to this neutral point. In addition, the surge wave can be detected at the neutral point as well as other power transmission lines as mentioned above. Thus, no problem would occur in providing the surge locating system through the neutral point of the secondary side of the transformer.

In this case, the surge can be properly detected in a predetermined transforming station or a generating station which are equipped with a transformer by installing necessary devices to that effect. The inventors of the present invention constructs the surge locating system on the power transmission line according to the present invention by making use of an inherent operating characteristic of GPT which is installed in almost every electric facility, such as transforming station.

The surge locating system according to the present invention detects an output voltage at the secondary side of the transformer, in particular, of GPT in the electric facilities in order to locate the surge occurred somewhere on the power transmission lines as mentioned above. The characteristics of the transformers in the electric facilities are optimized to transmit the power with a commercial frequency. That is, the transformers in the power transmission facility to which the present invention is applied are specially designed for dealing with the electric power with the commercial frequency, namely low frequency of 50 to 60 Hz.

On the power transmission line, there occur the surges with various characteristics in terms of the frequency, waveform, voltage and the like, and propagate on the power transmission line to reach the electric facilities nearby. In this case, the surge is introduced into the surge locating system of the power transmission line through the transformer installed in the electric facility. The inventors of the present invention found out the fact that there exists a certain relationship between the surge waveform introduced into the primary side of GPT and the waveform produced in the secondary side caused by the surge, and that as a result, the accuracy of the surge locating can be improved by utilizing the relationship.

When a high frequency wave, such as surge wave is introduced to the GPT, an output wave of a predetermined characteristic is generated in the secondary side thereof independent from the frequency characteristic of the input waveform. According to what the inventors of the present invention found out, when such high frequency wave as the surge wave is introduced into the GPT, the output wave generated in the secondary side thereof is of a substantially limited range of frequency regardless of the frequency of the input wave. Though the surge wave introduced to the primary side of the GPT is of a frequency ranging from about 100 kHz to about 1 MHz, the output wave is of a substantially constant frequency of about 3 MHz.

In this case, a voltage level of the output side of the GPT is reduced to approximately a factor of hundredth of the input side. In the surge locating system, it is important whether the stable output ratio of wave is gained in response to the input surge or not. Accordingly, if it is possible to make sure that a stable output ratio of wave is generated on the secondary side of the GPT in response to the surge in the case where the surge is introduced to the primary side of the GPT, the time length for the surge signal to reach the particular electric facility can be calculated by detecting the output wave. That is, the surge can be properly located.

The present inventors found out how to detect an output wave with a high reliability at the secondary side of the GPT in response to the surge occurred.

In one of the preferred embodiment of the present invention, the neutral point of the secondary side of the GPT is to be terminated to the ground at the other end. The surge locating system according to the present invention is installed between the neutral point of the secondary side of the GPT and the ground point.

The voltage generated in the neutral point is introduced through the secondary side of GPT into the surge locating system so as to store the detected time of the voltage. The detected time of the voltage is stored in the respective stations, and the surge point where the surge occurred is located based on the difference in detection time difference between the stations.

In this case, in the surge locating system according to the present invention, a maximum input voltage into the surge locating system is limited so as to prevent an excessively high level of surge voltage from being introduced into the surge locating system. The surge voltage is, for example, about as much as a million volt. It should, however, be noted that a signal level finally processed in the surge locating device is as low as about TTL signal level (some 10 mV to over 10 V). Therefore, the surge voltage level initially introduced to the electric facility shall be lowered up to a factor of millionth level of voltage. For this purpose, the surge locating system of the present invention is equipped with at least one voltage limiting device.

As described above, since a calculating device for the surge locating is a precision machine which is preferably equipped with a microprocessor and is actuated by an extremely low voltage, a signal processing section are electrically isolated from a surge voltage introducing section so that the surge voltage is not directly introduced into the signal processing section of the surge locating system. As a result, the processing unit can be kept from being exposed to such a high voltage as the surge voltage, and thus the surge locating system is prevented from being badly influenced due to the surge.

The above and other advantage of the present invention will be apparent from the description of the preferred embodiment taking reference with the attached drawings.

DETAILED DESCRIPTION OF PREFERRED EMBODIMENT

There will now be described preferred embodiment of the present invention in detail with reference to the attached drawings.

Figure 1:
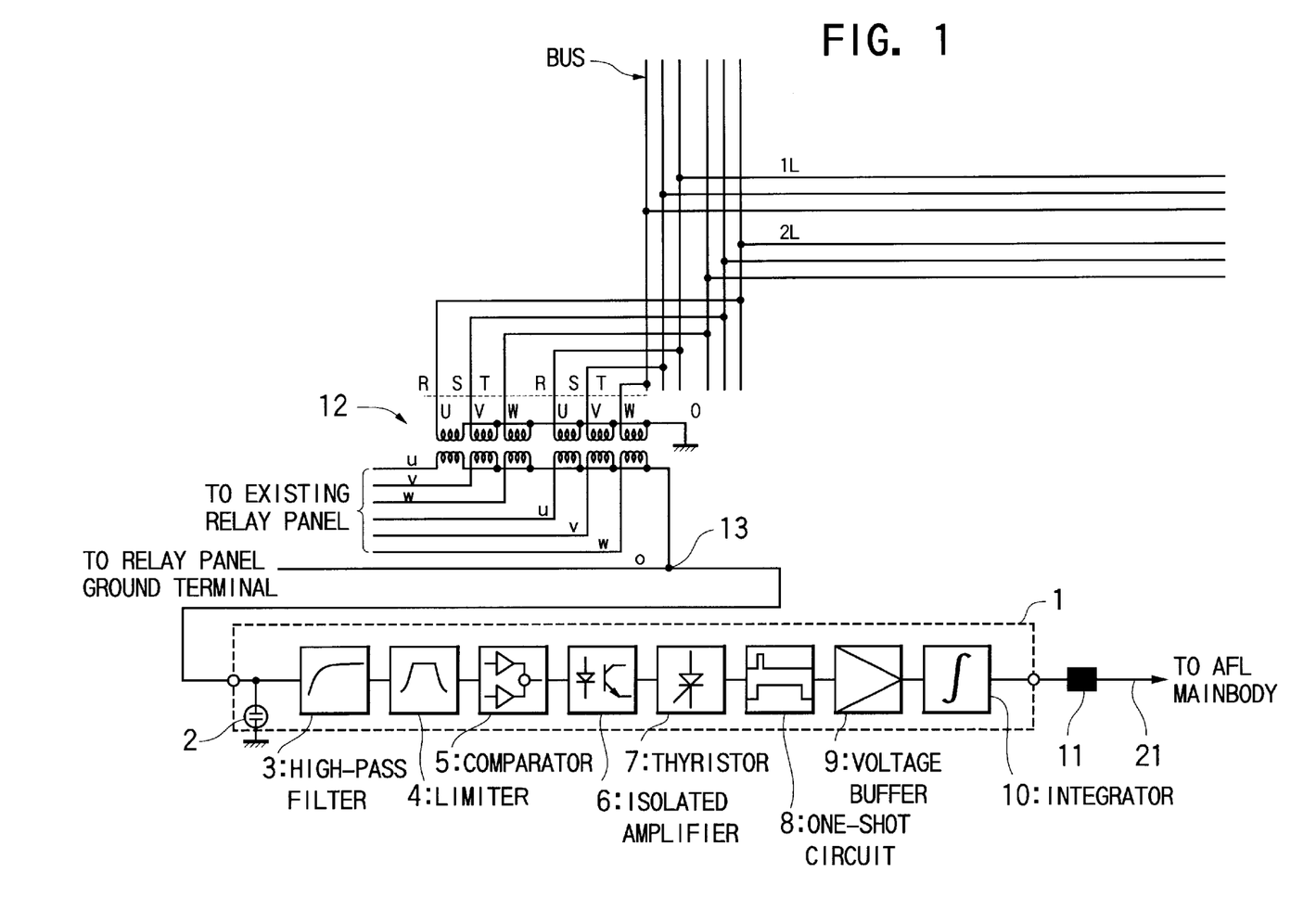
FIG. 1 is a block diagram of the surge introducing circuit of the surge locating system of the three-phase alternating current transmission line according to an embodiment of the present invention.

FIG. 1 is a schematic block diagram of an interface 1 of a surge locating system of the power transmission line of the embodiment according to the present invention, which introduces a surge on the power transmission line.

GPT-I/F, the interface 1 for introducing the surge, is equipped with a grounded gap (arrester) 2 and comprises a high-pass filter 3, a limiter 4, a comparator 5, an isolated amplifier 6, a thyristor 7, a one-shot circuit 8, a voltage buffer 9, an integrator 10, and an EO sensor 11, wherein the interface for introducing the surge precisely introduces a surge signal itself and sends it to the surge locating system while preventing a large capacity of surge from being applied to the surge locating system.

The surge locating system of the power transmission line according to the present invention is installed in the electric facility relating to the three-phase alternating power transmission line, for example, the sub station. In the present embodiment, the three-phase alternating wirings of the secondary side of GTP transformer (wire wound grounding potential transformer (GPT)) 12 in the generating station are Y-connected so as to tap out of a neutral point 13 thereof. To the tapping point of the neutral point are parallelly connected a gap 2, a high voltage discharging device. Thereby, the peak value higher than the predetermined value is discharged through the gap so that the higher voltage and current are prevented from being introduced into the surge introducing interface 1.

Figure 2:
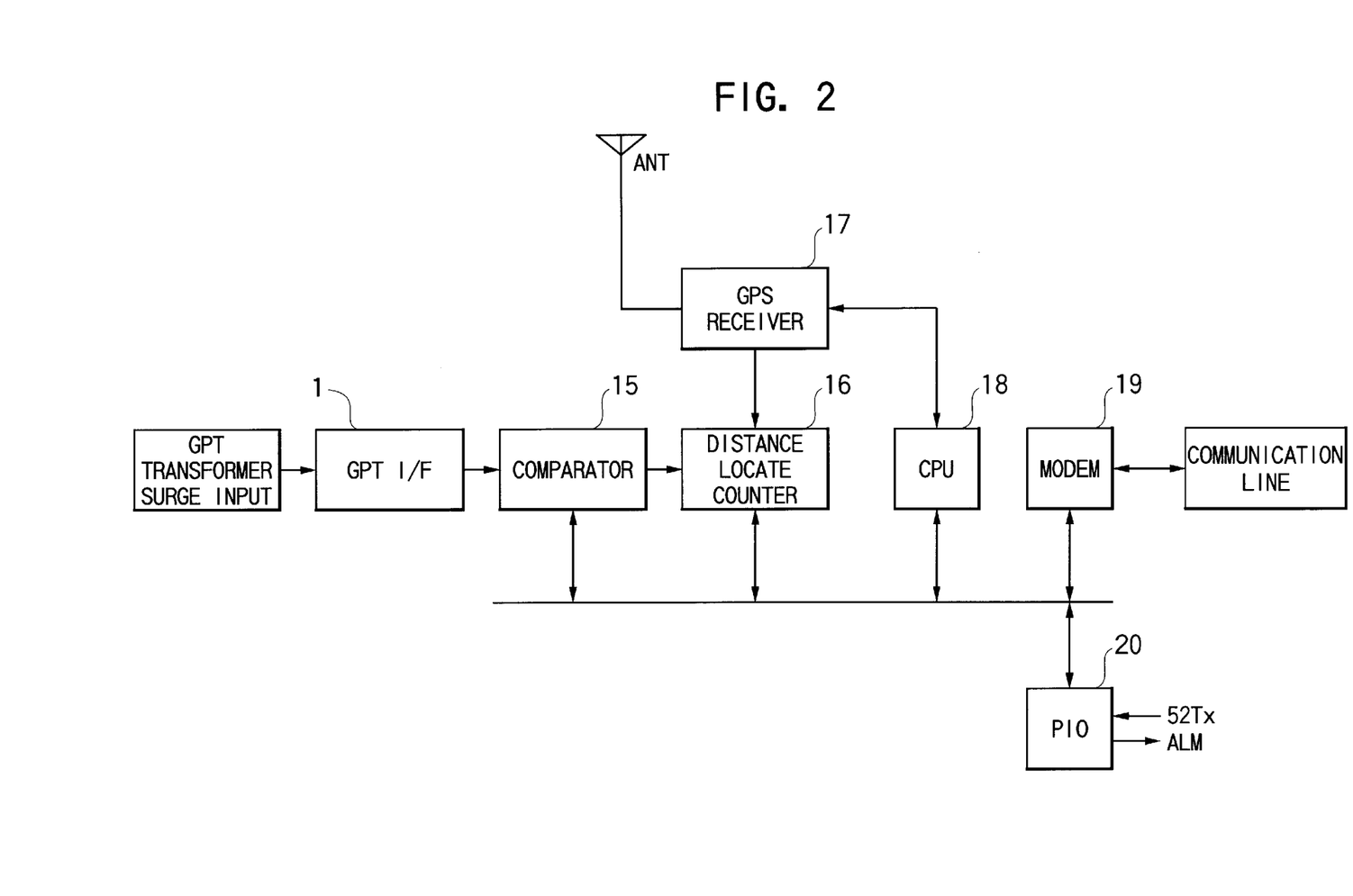
FIG. 2 is the diagram illustrating the structure of the GPT-FL of the surge locating system of the three-phase alternating current transmission line according to an embodiment of the present invention.

FIG. 2 is a schematic block diagram illustrating an arrangement of the GPT-FL.

The GPT-FL 14 according to the present embodiment comprises a comparator 15, a distance locating counter 16, a GPS receiver 17, a CPU 18, a modem 19, and a PIO 20.

Figure 3:
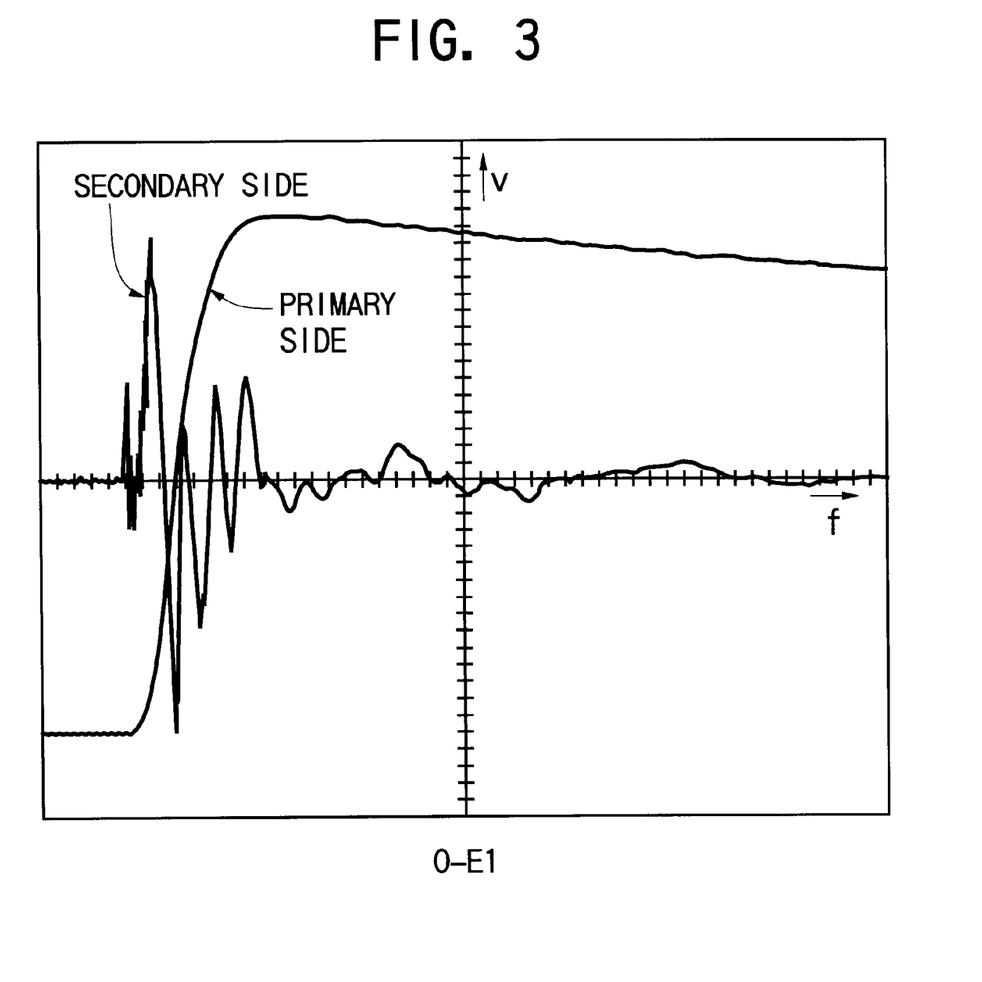
FIG. 3 is a graph illustrating an example of the surge wave detected in the neutral point of the three-phase alternating current transmission line.
Figure 4:
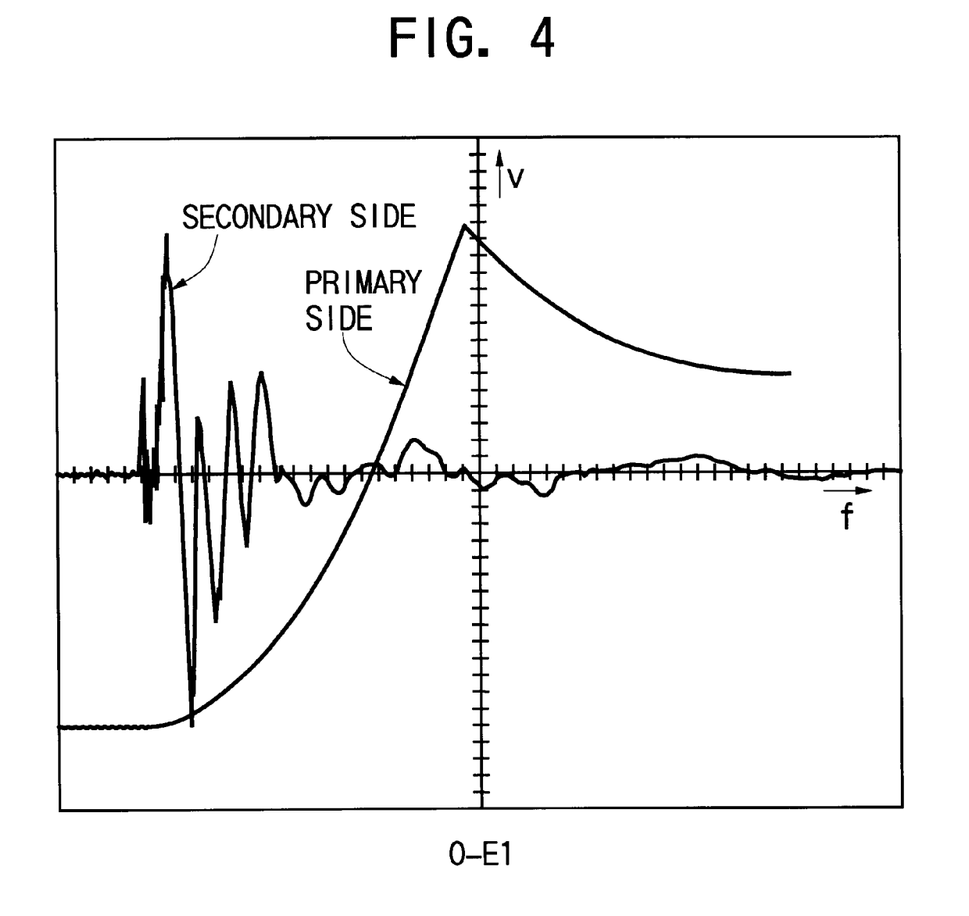
FIG. 4 is a graph illustrating another example of the surge wave detected in the neutral point of the three-phase alternating current transmission line.

FIGS. 3 and 4 show the relationships between the input waveforms A1 and A2 of the primary side and the output waveforms B1 and B2 of GPT respectively. The voltage level is adjusted so as to be the same level for the purpose of the illustration. It will be understood that the output waveforms are substantially the same regardless of the input waveforms when comparing FIG. 3 with FIG. 4.

The reason why the output waves are of substantially the constant characteristics regardless of the input waveforms is considered that the surge waves are of high frequencies that exceed the inherent frequency range of an iron core of the conventional wire wound grounding potential transformer (GPT). It is however, for the purpose of obtaining a detection of an arrival of the surge wave, rather convenient due to the fact that the output waves are not influenced by the characteristics of the input waves. This means that the waveform generated in the secondary side can be processed with a simple structure so as to be introduced to the surge locating device. Then, the arrival time of the surge wave can be obtained properly.

There will now be described procedures for introducing the surge and for processing the surge signal with the device according to the present invention.

When an O-E1 voltage waveform as shown in FIGS. 3 or 4 is observed at the neutral point 13, the signal is processed as described hereinafter. Though the secondary side voltage is damped into approximately a factor of hundredth of the primary side voltage due to a transforming function of GPT.

In the drawings, their levels are illustrated in the same level with difference scales.

As described above, at an input end of the surge introducing interface 1 connected in parallel with the gap (arrester) 2 is disposed the high-pass filter 3.

Figure 5:
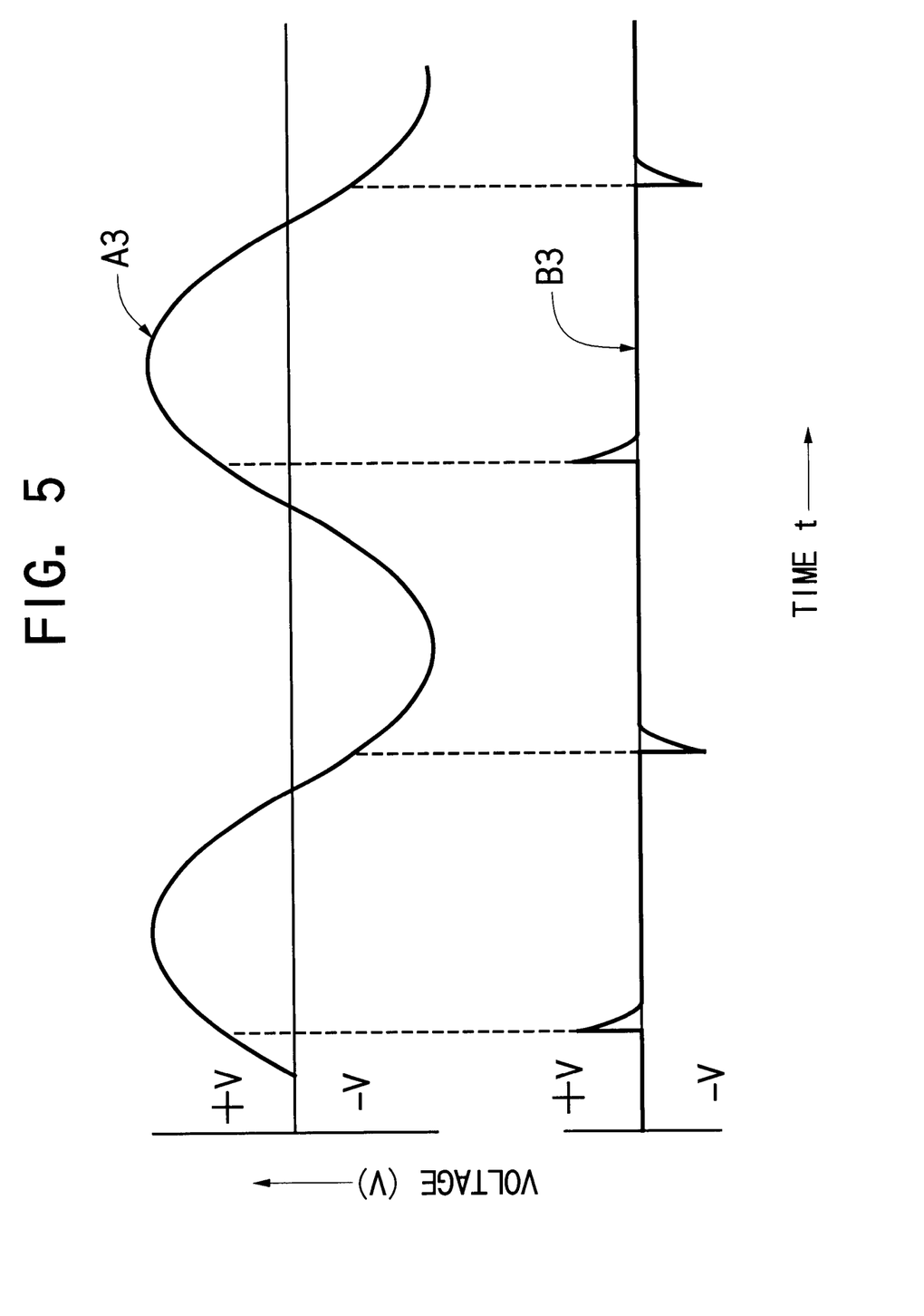
FIG. 5 is a graph illustrating an example of I/O characteristic of the arrester.

The higher the frequency is, the more the damping effect of the arrester 2 is. As shown in FIG. 5, for example, when a waveform A3 is introduced into the arrester 2, the output is given by a waveform B3.

Though the high voltage with the commercial frequency (50/60 Hz) is applied to the power transmission line, the high-pass filter 3 eliminates the voltage with this range of frequency to introduce only a high frequency wave (generally, more than 10 kHz). That is, the surge wave observed in the neutral point, as shown in FIG. 3, has extremely a high frequency comparing with the commercial frequency, and Thus, the wave with the commercial frequency is eliminated because it is not necessary for the surge locating.

The high-pass filter 3 is connected to the limiter 4. In the light of the fact that the gap 2 cannot completely control the peak value of the surge, the limiter 4 is provided so as to work as a voltage limiting circuit which introduces the surge wave possibly including some peak value and responds thereto in high speed in order to prevent the surge waveform from exceeding a withstand voltage of the circuit.

Therefore, it is sufficient enough that the gap 2 controls the surge peak value to be under the withstand voltage of the limiter 4.

The limiter 4 is connected to the comparator 5. The comparator 5 eliminates a noisy waveform with low peak value and outputs a pulse at the moment when a main surge waveform reaches up to the usable level for the surge locating. The pulse finally becomes a locating pulse for stopping the distance counter 16 of a locator.

The comparator 5 is connected to the isolated amplifier 6 composed of a photo coupler. The photo coupler 6 electrically insulates the surge introducing device up to the comparator 5 from the following surge processing device. Namely, the photo coupler 6 transfers only the surge signal to prevent the surge current or voltage from being transferred to the following surge processing device.

Figure 6:
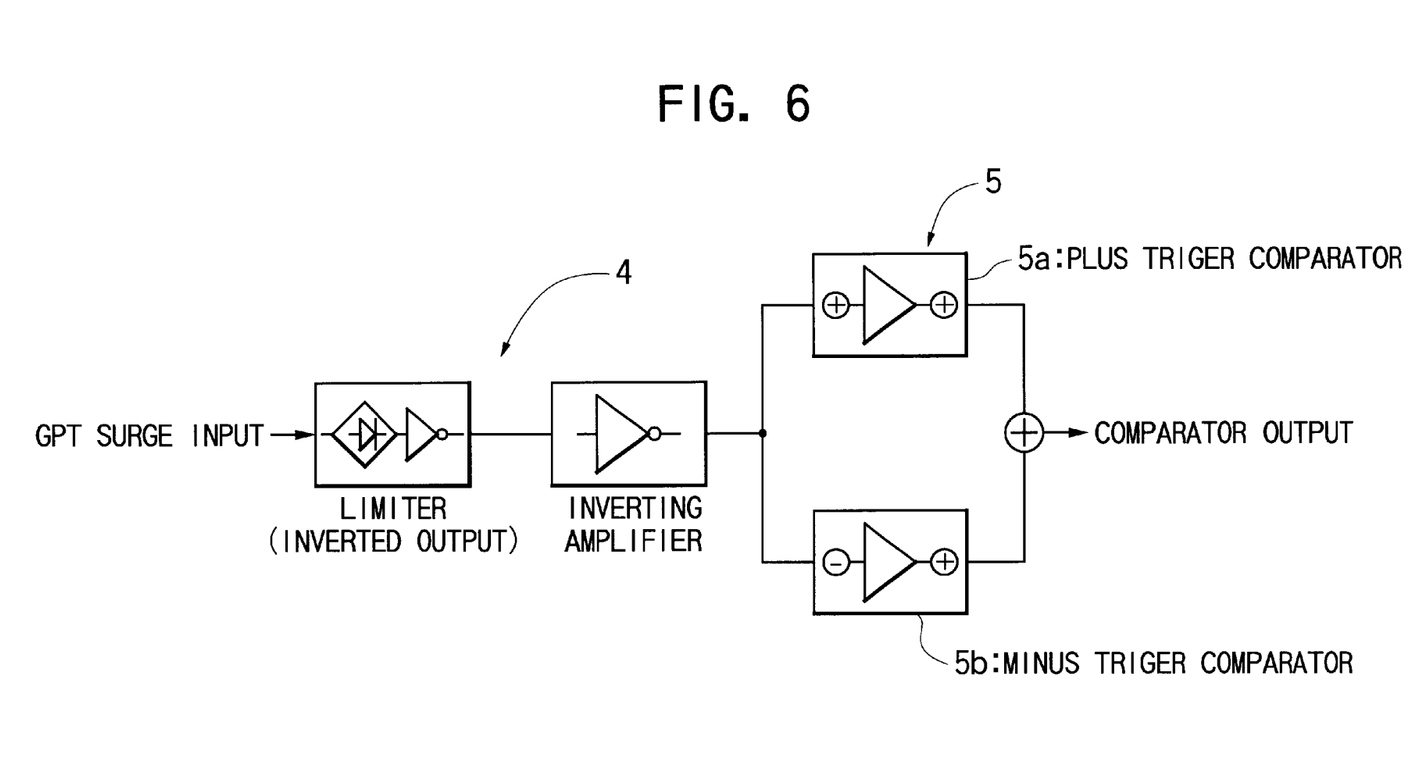
FIG. 6 is a circuit diagram of the limiter and the comparator which may be used in the present invention.

FIG. 6 shows examples of the limiter 4 and the comparator 5. The comparator 5 of the present embodiment is equipped with both a comparator for plus trigger 5a and a comparator for minus trigger 5b for processing both minus and plus surges.

The photo coupler 6 is further connected to the thyristor 7, which is triggered off and generates a high power pulse with a predetermined voltage when the input signal reaches up to a specific voltage. Accordingly, when the surge signal is introduced from the photo coupler 6 and the voltage level thereof is higher than the predetermined level, the pulse corresponding to the surge signal is generated. The thyristor 7 is further connected to the one-shot circuit 8.

The surge signal obtained from the GPT outputs also high level of noisy surge wave (reflected wave etc.) including many frequency components because of the I/O frequency characteristics thereof. In view of this, in the illustrated embodiment, the one-shot circuit is designed to operate as a pulse width expanding circuit so that the pulse width is elongated and is made to be variable (about 1 msec). As a result, the surge signals can be prevented from being overly introduced after the introduction of the top surge and from the subsequent circuits from multiply responding.

The signal from the one-shot circuit 8 is then introduced into the voltage buffer 9.

The voltage buffer 9 is a voltage transforming circuit for transforming the voltage of the one-shot output into a higher pulse voltage. The voltage buffer is connected to the integrator 10 or a CR delay.

The integrator 10 plays a role as described below.

A rise time of the pulse waveform obtained in the previous stage may be too short for the subsequent circuits to respond thereto properly resulting in failing to introduce it with a high voltage. The integrator 10 is effected to prevent this situation and also effected to remove high frequency noises which might overlap with the pulse output. In this case, the integrator operates particularly to lower the frequency component of a response output by means of a time constant due to a capacitor C and a resistance R so as for the waveform to rise up gradually and smoothly.

The signal from the integrator is introduced via the EO sensor 11 through an optical fiber 21 into the GPT-FL (Fault Locator).

As described taking reference to FIG. 1, the output of GPT is introduced via the I/F circuit 1 into the comparator 15 of the GPT-FL. As described above, the comparator 15 eliminates the noisy waveform with low peak value and outputs the pulse at the moment when the main surge waveform reaches up to the usable level for the surge locating.

In the illustrated embodiment, there is provided a GPS receiver 17 for receiving a GPS signal from a satellite (not shown), which generates a clock signal of 10 MHz and counts every 100 nano seconds. The clock signal is introduced into the distance locating counter 16. The counter 16 is cleared every integer second by this clock signal.

When the comparator 15 generates a signal, the signal is introduced into the counter 16 to stop the counter 16.

That is, the counter 16 counts a reference clock pulse from the GPS receiver 17 and stops counting at the moment when the surge pulse for locating is introduced. Thus, the system can determine the surge arrival time as an absolute time.

The count value representing the absolute time of the surge arrival is introduced into the CPU 18. To the CPU 18 are further connected the GPS receiver 17, the modem 19 and the PIO 20 respectively.

The CPU 18 carries out a read-out/control of the locating distance counter and a data-read-out/control of the GPS receiver and also carries out an actuation control of system management of such devices as a data-input-output/control of the PIO, and a data-input-output/control of the modem.

The modem 19 is a data modulation/demodulation circuit for transferring the locating data to such remote surge locating processing device as a master station. The surge detecting information including the surge arrival time is transferred to other station from the modem 19 through the predetermined communication network.

The PIO 20 is an external I/O interface circuit for inputting a relay signal 52Tx which informs that a fault has occurred on the power transmission line and a circuit breaker has been actuated and for outputting various alarm signals ALM of devices.

The time when the output from the comparator 15 stops the counter 16 is a surge arrival time, and this information is processed by the CPU 18 to be transferred to other station through the modem 19.

As mentioned above, the surge arrival time is an absolute time based on the GPS signal, so that the surge arrival time in each station can be evaluated based on the absolute time. Accordingly, the time difference of the surge arrival times may be accurately calculated in each station.

Figure 7:
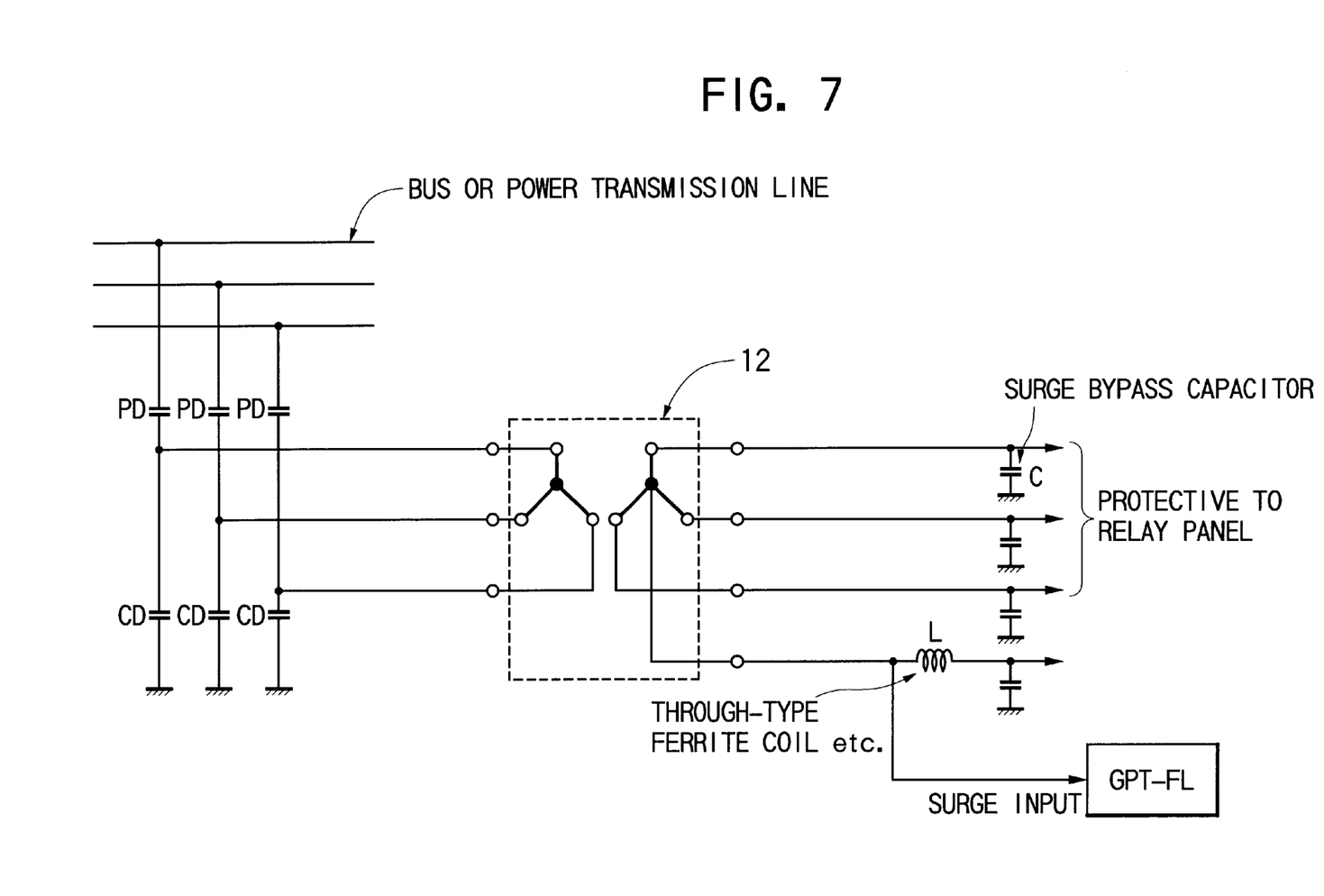
FIG. 7 is the overall circuit diagram illustrating the surge locating system according to another embodiment of the present invention.
Figure 8:
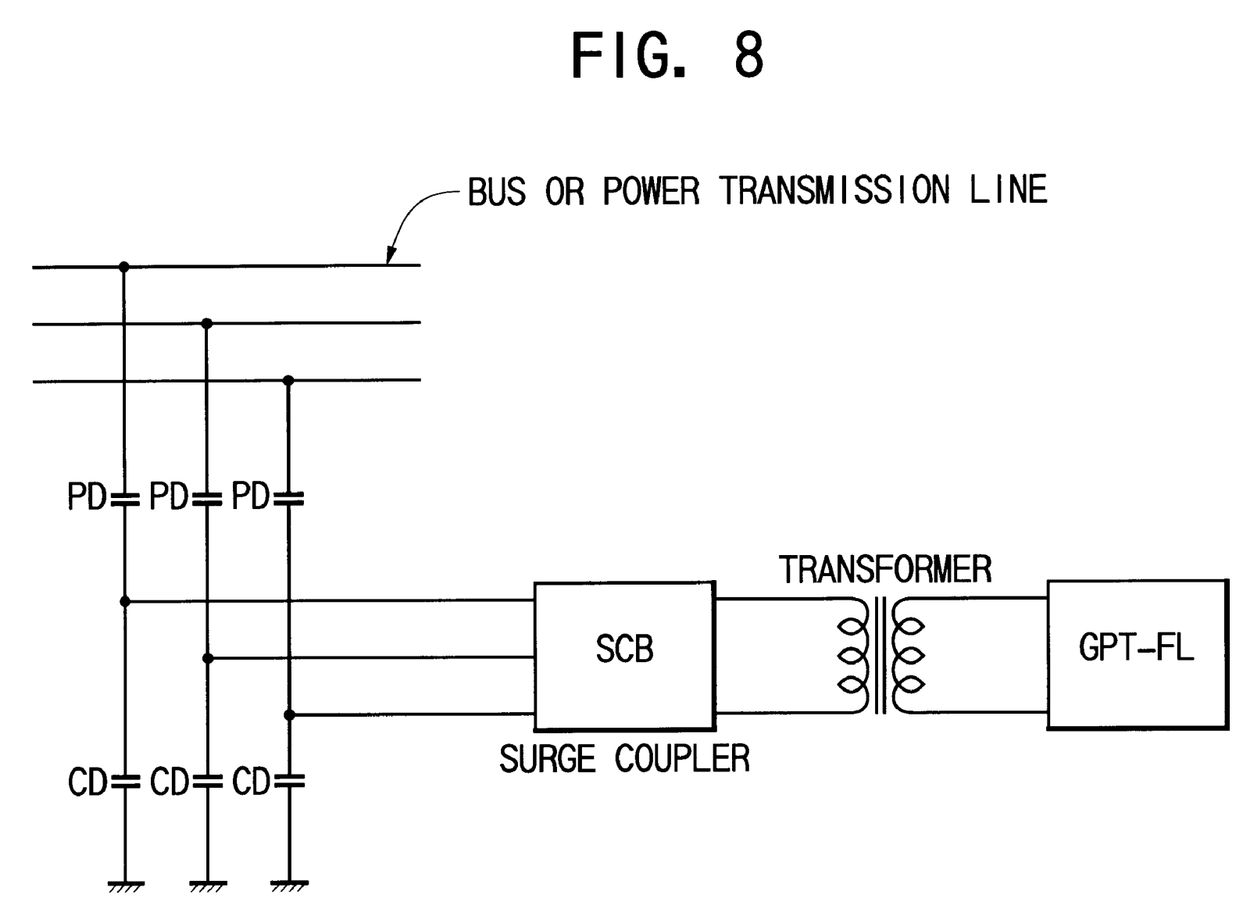
FIG. 8 is the overall circuit diagram illustrating the surge locating system according to another embodiment of the present invention.

FIG. 7 shows an example of the surge locating system according to another embodiment of the present invention. FIG. 8 shows an embodiment in which the surge introduced from the power transmission line is transferred to the GPT-F/L shown in FIG. 2 through a capacitance potential device (PD), a surge connecting board (SCB), and a wire wound transformer.

In this embodiment, the bus or the three-phase alternating current transmission line is connected to GPT 12 via the capacitance potential device (PD). The surge is taken out of the line connected to the secondary side neutral point of GPT. Other secondary side power transmission lines are connected to a protective relay board and terminated to the ground capacitors via surge by-pass condensers. Thereby, the surge is prevented from being introduced into the protective relay board so as not to cause a negative influence thereon. In the structure of the present embodiment, the surge is damped firstly by the capacitance potential device (PD) and is damped secondly by GPT, and then is introduced into the surge locating system. Thus, the present embodiment is suitable for surge locating of ultra-high voltage system because the surge wave is detected through two steps of transformers.

According to the present invention, the accurate surge locating can be accomplished in a simple method as mentioned above.

In the conventional surge locating method in which the surge locating is implemented based on the secondary side output whose frequency corresponds to that of the primary side input with the capacitance potential device (PD) being interposed, as described previously, since the surge waveforms arriving at respective measuring points do not have the same form but have deformations and the deformation shall be compensated in order to evaluate it, the conventional method has a disadvantage in the precision because this method of evaluation directly gives an influence on the surge locating accuracy.

According to the present invention, however, the output is taken out of the secondary side via GPT which generates an output wave having an approximately constant range of frequency without regard to the frequency of the input waveform. Therefore, according to the present invention, the output based on the surge response is to be merely detected in the secondary side of GPT, and this means that there is no need for compensating the detected surge waveform, which is necessary in the conventional method, and the processes as well as the devices may be simplified.

Especially, when the surge is taken out of the secondary side of GPT, at the neutral point of Y-connected three-phase alternating current transmission line, the secondary side output wave based on the extremely sharp and clear surge wave response may be detected. Accordingly, by introducing this secondary side output wave into the surge locating system and by executing the surge locating based on the detected time of the secondary side output wave, the surge locating may be accomplished with high accuracy.

Although the present invention has been explained in connection with the preferred embodiment, the spirits and scope can be limited only by the attached claims.

What is claimed is:

1. A surge locating system of a power transmission line for locating a point where a surge occurs by receiving in at least two stations independently the surge which occurs on a power transmission line, said surge locating system of a power transmission line comprising:

surge detecting means in each station for detecting a surge which occurs on the power transmission line, said surge detecting means being connected to a neutral point of a secondary side of a wire wound grounding potential transformer (GPT) connected to said power transmission line;

said surge detecting means including surge judging means which determines a surge arrival time when a surge is detected having a voltage higher than a predetermined level;

time difference calculating means in communication with said surge judging means in said at least two stations for calculating a time difference between said surge arrival times determined by said surge judging means in respective stations; and locating means for locating a point where the surge occurs based on said time difference.

2. A surge locating system of a power transmission line as recited in claim 1, in which said neutral point is a neutral point of Y-connection of the three-phase alternating current transmission line.

3. A surge locating system of a power transmission line as recited in claim 1, in which, when the surge from the power transmission line is received via a capacitance potential device (PD), said surge is introduced further via a wire wound transformer.

4. A surge locating system of a power transmission line as recited in claim 1, in which said surge detecting means further comprises a voltage limiting means which controls a voltage higher than said predetermined level so as not to be introduced.

5. A surge locating system of a power transmission line as recited in claim 1, in which a high-pass filter which passes a voltage waveform with a frequency higher than a predetermined level is further installed in said secondary side neutral point.

6. A surge locating system of a power transmission line as recited in claim 5, in which said surge detecting means is connected to said high-pass filter and is equipped with a low-pass filter which passes only a voltage waveform with a frequency lower than a predetermined level.

7. A surge locating system of a power transmnission line as recited in claim 1, in which said surge detecting means is equipped with a transforming means which transforms the surge voltage into other kind of physical quantity.

8. A surge locating system of a power transmission line as recited in claim 7, in which said transforming means is a photo coupler.

9. A surge locating method of a power transmission line for locating a point where a surge occurs by receiving in at least two stations independently the surge which occurs on a power transmission line, said surge locating method of a power transmission line comprising:

monitoring in each station voltage on a neutral point of a secondary side of a wire wound grounding potential transformer (GPT) connected to the power transmission line;

determining a surge arrival time when a voltage higher than a predetermined level is detected at said neutral point of the secondary side of the wire wound grounding potential transformer (GPT) connected to the power transmission line;

calculating a time difference of said surge arrival times between at least said two stations; and locating a point where the surge occurs based on said time difference.

* * * * *